US009340896B2

(12) United States Patent
Roberts

(10) Patent No.: US 9,340,896 B2
(45) Date of Patent: May 17, 2016

(54) PURIFICATION OF A METALLOID BY CONSUMABLE ELECTRODE VACUUM ARC REMELT PROCESS

(75) Inventor: Raymond J. Roberts, Moorestown, NJ (US)

(73) Assignee: CONSARC CORPORATION, Rancocas, NJ (US)

( * ) Notice: Subject to any disclaimer, the term of this patent is extended or adjusted under 35 U.S.C. 154(b) by 812 days.

(21) Appl. No.: 13/586,149

(22) Filed: Aug. 15, 2012

(65) Prior Publication Data
US 2013/0047670 A1 Feb. 28, 2013

Related U.S. Application Data

(60) Provisional application No. 61/527,799, filed on Aug. 26, 2011.

(51) Int. Cl.
*C01B 33/02* (2006.01)
*C30B 11/00* (2006.01)
*C30B 29/06* (2006.01)
*C01B 33/037* (2006.01)

(52) U.S. Cl.
CPC ............. *C30B 11/003* (2013.01); *C01B 33/037* (2013.01); *C30B 29/06* (2013.01); *Y02P 20/129* (2015.11)

(58) Field of Classification Search
None
See application file for complete search history.

(56) References Cited

U.S. PATENT DOCUMENTS

| 4,435,818 A | 3/1984 | Stenzel et al. |
| 4,505,948 A | 3/1985 | Pinkhasov |
| 4,832,922 A | 5/1989 | Nishizawa |

FOREIGN PATENT DOCUMENTS

| CN | 101935040 A | * | 1/2011 | ............ C01B 33/037 |
| EP | 0150543 A1 | | 8/1985 | |
| JP | 08-035019 A1 | | 2/1996 | |

OTHER PUBLICATIONS

Written Opinion of the International Search Authority, (2013), pp. 1-5.*

* cited by examiner

*Primary Examiner* — Melvin C Mayes
*Assistant Examiner* — Michael Forrest
(74) *Attorney, Agent, or Firm* — Philip O. Post

(57) ABSTRACT

A metalloid such as silicon in the form of a preheated solid electrode is purified by a CEVAR purification process by producing an ingot with controlled heating and cool down after the preheated electrode is melted in a CEVAR furnace system using a short CEVAR open-bottomed crucible.

12 Claims, 1 Drawing Sheet

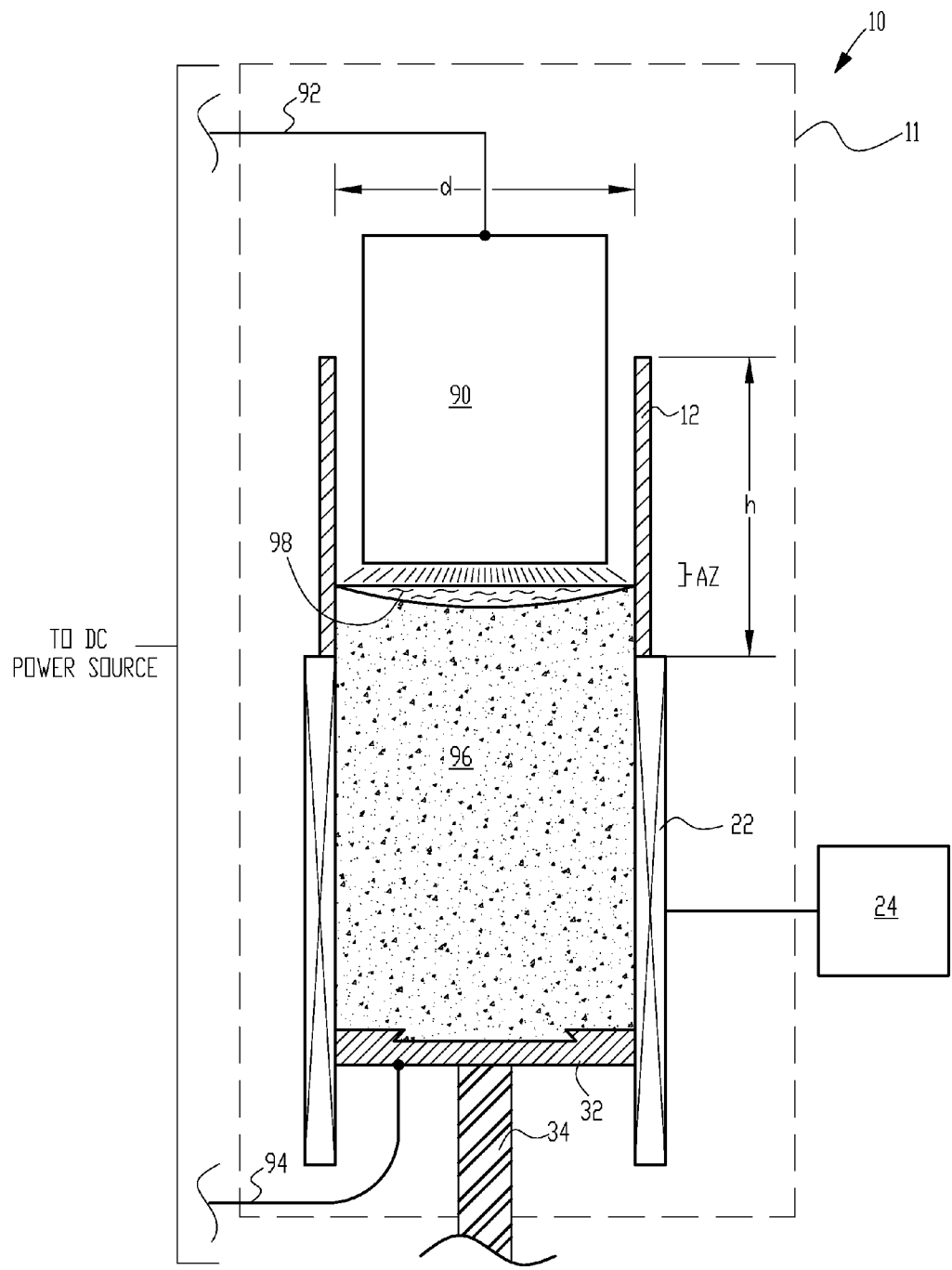

PURIFICATION OF A METALLOID BY CONSUMABLE ELECTRODE VACUUM ARC REMELT PROCESS

CROSS REFERENCE TO RELATED APPLICATIONS

This application claims the benefit of U.S. Provisional Application No. 61/527,799 filed Aug. 26, 2011, hereby incorporated herein by reference in its entirety.

FIELD OF THE INVENTION

The present invention relates to production of a purified metalloid such as silicon by a consumable electrode vacuum arc remelt process.

BACKGROUND OF THE INVENTION

High purity silicon is needed for many kinds of electronic components such as silicon transistors, silicon integrated circuits and silicon solar cells. Since the invention of the first silicon transistor, many processes have been developed for producing silicon having the required purity levels.

A process that has been used for producing high quality metals such as steels, nickel-based superalloys, titanium etc. is known as a consumable electrode vacuum arc remelt (CEVAR) process. See, for example, U.S. Pat. No. 3,187,079 (Pestel); U.S. Pat. No. 3,344,840 (Buehl et al.); U.S. Pat. No. 3,480,716 (Lynch et al.); U.S. Pat. No. 4,303,797 (Roberts); U.S. Pat. No. 4,569,056 (Veil, Jr.); and United States Patent Application Publication No. 2008/0142188 A1 (Ishigami) for various technical aspects of the CEVAR process, all of which publications are incorporated herein in their entireties by reference. The CEVAR process is differentiated from a non-consumable electrode vacuum arc remelt where a non-consumable electrode, for example a graphite or tungsten electrode, is used to melt titanium or zirconium, for example, as disclosed in U.S. Pat. No. 3,546,348 (DeCorso). United States Patent Application Publication No. 2010/0154475 A1 (Matheson et al.) discloses a primary silicon purification process with similarities to the Kroll purification process of titanium with brief mention of a secondary silicon composition purification process that involves high temperature vacuum melting of a silicon composition that comprises a boron and phosphorus doped silicon with silicon purity in the range of 99.99 percent to 99.9999 percent.

Generally the CEVAR process produces a purified metal by these four steps: (1) evaporating impurities as the metal electrode is melted and exposed to a vacuum in the CEVAR furnace; (2) floating out of the liquid (melted) metal impurities that have a lower density than the metal electrode being melted; (3) dissociating molecular impurities by exposing them to the high energy plasma in the arc zone between the lower end of the electrode and the pool of molten (liquid) metal above the ingot being formed; and (4) solidification segregation, which results in impurity levels in the solidified metal of the ingot being lower for certain elements than the impurity levels in the adjacent liquid metal from which the solid ingot is being formed.

In the usual CEVAR process a room temperature metal electrode is charged into the CEVAR furnace, which is then evacuated to a vacuum. A high magnitude direct current (DC current) arc is then struck between the lower end of the electrode and the CEVAR water-cooled crucible. The arc causes the lower end of the electrode to melt, whereupon the molten metal falls into the closed bottom crucible, where it solidifies and then cools, to form a purified ingot.

Despite the ability of the CEVAR process to purify various metals, the process is not known to be used to purify a metalloid such as silicon. Since silicon is a semiconductor and not a metal in its relatively pure state (though in need of further purification for the above-mentioned end uses), it has a relatively high electrical resistivity at or near room temperature. In fact, a silicon electrode sufficiently pure to be a candidate for purification by the CEVAR process, would have an electrical resistance that is far too high to permit the passage of such a high arc current at any reasonable applied voltage when it is at or near room temperature.

The metal of the solidified ingot formed in the conventional CEVAR process is initially at its solidus temperature and then cools progressively within the water cooled crucible, with the edges of the ingot cooling more rapidly than the center due to the proximity of the edges to the adjacent water cooled wall of the crucible. This generates stresses in the ingot due to differential thermal contraction, a process that puts the ingot surface in tension and the center in compression. For the metals usually melted by the CEVAR process this is not a problem, since they are relatively ductile, that is, resistant to cracking. However, in the case of any conventional CEVAR process that is used to melt silicon, which is brittle over a wide range of temperatures, such an ingot would be prone to undesirable cracking.

It is one object of the present invention to provide apparatus and method for purification of a metalloid such as silicon that includes a CEVAR furnace and process.

BRIEF SUMMARY OF THE INVENTION

In one aspect the present invention is an apparatus for, and method of, producing an ingot of a purified metalloid such as silicon. A silicon electrode can be formed from one or more pieces of silicon. The electrode is preheated to a temperature at which it becomes sufficiently conductive to pass current in a subsequent CEVAR purification processing step without excessive voltage drop and cracking of the electrode, and then melted in a CEVAR purification process that includes a short CEVAR open-bottomed and water-cooled crucible. The hot ingot resulting from the CEVAR process passes into a heating system adjacent to the open-bottom of the short CEVAR opened-bottomed crucible while the ingot is still hot, with the heating system being controlled to prevent cracking of the silicon ingot as it cools.

In another aspect the present invention is a metalloid purification CEVAR furnace system that includes a short CEVAR open-bottomed crucible having means to contain the arc zone in a CEVAR purification process. A heating system is provided adjacent to the open bottom of the short CEVAR open-bottomed crucible, and the heating system has means to provide controlled cooling of a hot ingot formed in the short CEVAR opened-bottomed crucible to prevent cracking of the ingot as it cools. An ingot withdrawal drive system is provided to withdraw the ingot from the crucible at a rate equal to its vertical growth rate during steady state of the CEVAR purification process, such that the arc zone and the top of the solidified ingot remain within the CEVAR crucible. Alternatively a crucible/heater drive system can be provided to lift the short CEVAR opened-bottom crucible, the electrode and the heater that provides a temperature-controlled thermal environment for the hot ingot as the ingot remains stationary.

The above and other aspects of the invention are set forth in this specification and the appended claims.

BRIEF DESCRIPTION OF THE DRAWINGS

The figures, in conjunction with the specification and claims, illustrate one or more non-limiting modes of practicing the invention. The invention is not limited to the illustrated layout and content of the drawings.

FIG. 1 is a simplified cross sectional view of one example of a CEVAR furnace system of the present invention.

DETAILED DESCRIPTION OF THE INVENTION

In the present invention of producing a silicon ingot from a silicon electrode in a CEVAR purification process, the initial process step is pre-heating of the silicon electrode that is to be used in the CEVAR process. The resistivity of silicon drops rapidly with increase in temperature, so a silicon electrode that has been preheated to a sufficiently high temperature, while remaining below its melting temperature so that it stays a solid (a necessary condition for the CEVAR melting process), will permit the passage of sufficient arc current to allow the CEVAR process to be started. The required preheat temperature for the electrode in a particular CEVAR melting process can be designated the CEVAR process resistivity as determined by the process parameters for the particular CEVAR melting process. Such a preheat temperature would need to be at least several hundreds of degrees Centigrade. Additionally increasing the electrode's preheat temperature reduces the initial voltage drop in the electrode, so it permits the use of a lower voltage, less-expensive power supply.

Preheating of the electrode may be accomplished either within the CEVAR furnace or externally. External heating, for example in a resistance furnace having a vacuum or inert gas (controlled) atmosphere, may result in pickup of oxygen and nitrogen at the electrode surface as the electrode is transferred in air to the CEVAR furnace, with risk of increasing the impurity level of the subsequent CEVAR ingot. Optionally a vacuum lock chamber may be provided between an external furnace chamber and the CEVAR furnace to establish a controlled environment without exposing the electrode to air during the transfer.

As the heated electrode is melted in the CEVAR furnace, the passage of arc current in the CEVAR process can be used to maintain the electrode's temperature, or an auxiliary electrode heating system internal to the CEVAR furnace may be used to maintain the electrode's temperature during the CEVAR process. In either case, it is advantageous to provide thermal insulation within the CEVAR furnace around the electrode to decrease the energy consumed during the process. For example a carbon fiber thermal insulating material can be used to at least partially surround the electrode in the CEVAR furnace.

In the present invention, a short CEVAR crucible (used in the CEVAR furnace) is preferably used that has an interior height, h, somewhere in the range of the diameter, d, of the ingot that is formed in the crucible; for example, the interior height of the short CEVAR crucible can be greater than 60 percent of the diameter of the formed silicon ingot and less than 120 percent of the diameter of the formed silicon ingot. Alternatively if the cross section of the interior wall of the short CEVAR crucible is rectangular in shape, the interior height of the crucible is somewhere in the range of the length of a rectangular side of the ingot that is formed in the crucible; for example, the interior height of a rectangular short CEVAR crucible can be greater than 60 percent of the rectangular side of the formed silicon ingot and less than 120 percent of the rectangular side of the formed silicon ingot. In a conventional CEVAR process with a closed-bottom crucible, the interior height of the crucible would be much greater than the height of the ingot as disclosed, for example, in U.S. Pat. No. 4,131,754 (Roberts).

The CEVAR purification process utilized in the present invention is generally similar to that described, for example, in the above disclosed prior art except for preheat of the silicon electrode used in the CEVAR process and the use of a short CEVAR open-bottomed, water-cooled metal crucible as disclosed herein. Generally for the present invention, during the CEVAR purification process, the preheated silicon electrode is placed in a short CEVAR open-bottomed crucible within the CEVAR furnace that is made gas-tight and brought to a vacuum or an otherwise controlled environment. During the process, direct current (DC current) flowing through the electrode and the melt formed below the electrode establishes an arc between the lower end of electrode and the top of the melt with the arc zone remaining within the height of the short CEVAR opened-bottom crucible so that a hot (at a temperature elevated above room temperature) solidified ingot exits the bottom of the short CEVAR opened-bottom crucible. Further controlled cooling of the hot solidified ingot exiting from the short CEVAR opened-bottom crucible is, as further described below, performed to substantially avoid cracking of the solidified ingot.

The ingot is withdrawn from the short CEVAR crucible into a heater system that provides controlled cooling over the temperature range in which the ingot is likely to crack. The ingot withdrawal rate is essentially matched to the ingot growth rate during steady state operation, so that the arc zone and the top of the ingot remain within the crucible. In an alternative arrangement of the present invention, the ingot is kept stationary and the crucible, electrode and the crucible's exit heater are raised together, to essentially match the growth rate of the ingot.

In practice of one embodiment of the present invention, the following process steps are performed: (1) forming an electrode from one or more pieces of silicon; (2) preheating the electrode to a temperature (by way of example and not limitation, between 800 and 1200 degrees Centigrade) at which it becomes sufficiently conductive (with a CEVAR process resistivity) to pass current in a subsequent CEVAR processing step without excessive voltage drop and prevention of cracking of the electrode; (3) melting the electrode by a CEVAR process; (4) causing the resulting hot ingot to pass into a heating system adjacent to the open-bottomed CEVAR crucible while the ingot is at a sufficiently elevated temperature to prevent cracking; and (5) controlling the heating system so as to prevent cracking of the silicon ingot as it cools.

In alternative examples of the invention, the above preheating process step (2) may be performed within the CEVAR furnace or external to the furnace as described above.

In alternative examples of the invention, the above melting of the electrode may include the process step of thermally insulating the electrode while the melting step is performed.

FIG. 1 illustrates one example of a CEVAR furnace system 10 of the present invention. A DC circuit is formed between electrode 90 and short CEVAR opened-bottom crucible 12 with conductors 92 and 94 diagrammatically illustrating the connection to an external DC POWER SOURCE. Electrode 94 (typically the positive potential electrode) is electrically connected to base 32 (or alternatively drive actuator 34).

In FIG. 1 the CEVAR furnace system 10 is shown in mid (steady state) CEVAR melting process with a hot solidified ingot 96 partially formed within the crucible's interior height.

A pool of molten (liquid) metal 98 on the top of the ingot is formed as fused droplets of metal fall from the preheated electrode 90 through arc zone AZ. A heating system is provided adjacent to the open bottom of the short CEVAR opened-bottom crucible, with the heating system providing controlled cooling of the ingot formed in the crucible so as to prevent cracking of the ingot. The heating system includes ingot heater 22 that surrounds the hot ingot exiting the opened-bottom crucible and ingot heater controller 24 that provides a temperature-controlled thermal environment for the ingot as it passes through the ingot heater. The temperature-controlled thermal environment is provided to allow controlled conductive heating into the interior of the ingot (sometimes referred to as heat "soaking") and controlled thermal radiation from the exterior surfaces of the ingot as the ingot cools so that cracking can be avoided.

The gas-tight CEVAR furnace chamber 11 is diagrammatically illustrated in FIG. 1 with dashed lines and includes a gas tight seal for drive actuator 34, which is further described below.

An ingot withdrawal drive system can be provided to withdraw the solidified ingot at a rate substantially equal to its vertical growth rate during steady state CEVAR process operation, such that the arc zone and the top of the solidified ingot remain within the crucible, or alternatively, a drive system can be provided that lifts the crucible, electrode and ingot heater while the solidified ingot remains stationary. At the beginning and end of the CEVAR purification process the ingot withdrawal rate will vary due to transient startup and end process parameters. As shown in FIG. 1 the ingot withdrawal drive system can include base 32 upon which the bottom of the solidified ingot sits and drive actuator 34 that controls the rate of withdrawal (drop) of the ingot from the crucible in the downward direction. Base 32 can be configured with a contour that enhances interlocking contact with the bottom of the solidified ingot. For example as shown in FIG. 1 base 32 is configured with a dovetail interface with the bottom of solidified ingot 96. This is advantageous if the solidified ingot side wall develops a resistance contact with the interior side wall of the short CEVAR opened-bottom crucible since drive actuator 34 can pull down the base with interlocked solidified ingot in opposition to the side wall resistance.

As in a conventional CEVAR furnace, an electrode drive system (not shown in the FIGURE) is provided to lower the preheated silicon electrode as its lower end is melted and drips off of the electrode during the CEVAR purification process.

By way of example and not of limitation, for a 200 cm long and 30 cm diameter silicon electrode that is to be melted at 7,000 amperes DC in a CEVAR purification process of the present invention, it may be desirable to limit the initial voltage drop in the electrode to 5 volts DC since this is a moderate value in comparison to the typical CEVAR process arc voltage within the range of 20 to 40 volts DC (as a function of pressure within the CEVAR furnace). In such an example, conventional calculations indicate that the silicon electrode would require preheating to a temperature that results in a silicon resistivity of 2,524 microhm-cm (CEVAR process resistivity) of the electrode. The temperature needed to achieve this CEVAR process resistivity would depend on the types and levels of impurities in the silicon electrode used in a particular application of the present invention with the temperature increasing as the silicon purity of the silicon electrode increases.

The shape of the formed silicon ingot, and therefore the interior wall shape of the short CEVAR opened-bottom crucible, may be of various cross sectional configurations, including cylindrical or rectangular, and with or without an upward tapering inner diameter or perimeter to facilitate downward movement of the ingot as the hot solid ingot is formed.

In some examples of the invention, continuous charging of the CEVAR furnace with preheated electrodes can be performed so that the resulting continuous ingot is formed from a succession of multiple preheated electrodes. In these examples, an ingot cut-off apparatus can be provided to cut off sections of the resulting continuous ingot for removal of ingot sections as the continuous CEVAR purification process continues.

In the above examples of the invention, the word "Vacuum" in CEVAR means melting at any level of pressure below one atmosphere.

In other examples of the invention, the melting may be advantageously conducted at atmospheric pressure or even above, in an inert gas atmosphere, and such "pressure arc melting" of silicon is within the scope of the present invention.

The present invention has been described in terms of preferred examples and embodiments. Equivalents, alternatives and modifications, aside from those expressly stated, are possible and within the scope of the invention. Those skilled in the art, having the benefit of the teachings of this specification, may make modifications thereto without departing from the scope of the invention.

The invention claimed is:

1. A method of producing a silicon ingot from a silicon electrode in a CEVAR purification process performed in a short CEVAR open-bottomed crucible disposed in a CEVAR furnace, the method comprising:
   heating the silicon electrode to a heated temperature below the melting point of the silicon electrode prior to initiation of the CEVAR purification process to form a preheated silicon electrode having a CEVAR process resistivity;
   melting the preheated silicon electrode by the CEVAR purification process for formation of a silicon ingot at an elevated temperature at the open bottom of the short CEVAR opened-bottomed crucible;
   passing the silicon ingot at the elevated temperature through a heating system adjacent to the short CEVAR open-bottomed crucible; and
   regulating the heating system to provide a temperature-controlled thermal environment for the silicon ingot at the elevated temperature as the silicon ingot exits the short CEVAR open-bottomed crucible to cool the silicon ingot without cracking.

2. The method of claim 1 where heating the silicon electrode is performed in an external heating chamber prior to placing the preheated silicon electrode in the CEVAR furnace and transfer of the preheated silicon electrode from the external heating chamber to the CEVAR furnace is accomplished in a controlled environment.

3. The method of claim 1 where heating the silicon electrode is performed subsequent to placing the silicon electrode within the CEVAR furnace.

4. The method of claim 1 where heating the silicon electrode further comprises heating the silicon electrode to the heated temperature within the range of 800 to 1,200 degrees Centigrade to form the preheated silicon electrode.

5. The method of claim 1 further comprising thermally insulating the preheated silicon electrode while melting the preheated silicon electrode by the CEVAR purification process.

6. The method of claim 1 further comprising heating the preheated silicon electrode during the CEVAR purification process with an auxiliary heater apparatus disposed within the CEVAR furnace.

7. The method of claim 6 further comprising thermally insulating the preheated silicon electrode while melting the preheated silicon electrode by the CEVAR purification process.

8. A method of producing a silicon ingot from a silicon electrode in a CEVAR purification process performed in a short CEVAR open-bottomed crucible disposed in a CEVAR furnace, the method comprising:

heating the silicon electrode to a heated temperature below the melting point of the silicon electrode in a heating chamber external to the CEVAR furnace to form a preheated silicon electrode having a CEVAR process resistivity;

placing the preheated silicon electrode in the CEVAR furnace;

melting the preheated silicon electrode by the CEVAR purification process for formation of a silicon ingot at an elevated temperature at the open bottom of the short CEVAR opened-bottomed crucible;

passing the silicon ingot at the elevated temperature through a heating system adjacent to the short CEVAR open-bottomed crucible; and regulating the heating system to provide a temperature-controlled thermal environment for the silicon ingot at the elevated temperature as the silicon ingot exits the short CEVAR open-bottomed crucible to cool the silicon ingot without cracking.

9. The method of claim 8 further comprising thermally insulating the preheated silicon electrode while melting the preheated silicon electrode by the CEVAR purification process.

10. The method of claim 9 further comprising heating the preheated silicon electrode during the CEVAR purification process with an auxiliary heater apparatus disposed within the CEVAR furnace.

11. The method of claim 8 further comprising heating the preheated silicon electrode during the CEVAR purification process with an auxiliary heater apparatus disposed within the CEVAR furnace.

12. The method of claim 11 further comprising thermally insulating the preheated silicon electrode while melting the preheated silicon electrode by the CEVAR purification process.

\* \* \* \* \*